United States Patent [19]
Arai

[11] 3,747,201
[45] July 24, 1973

[54] MAGNETORESISTANCE ELEMENT AND METHOD OF MAKING THE SAME

[75] Inventor: Michio Arai, Tokyo, Japan

[73] Assignee: Sony Corporation, Tokyo, Japan

[22] Filed: July 20, 1970

[21] Appl. No.: 56,444

[30] Foreign Application Priority Data

July 22, 1969 Japan ............................ 44/57819

[52] U.S. Cl. ...................... 29/574, 29/580, 29/590, 317/235 H, 317/235 AD, 317/235 AJ, 317/234 N, 156/17, 148/187

[51] Int. Cl. .......... H01l 5/00, H01l 7/50, H01l 9/10

[58] Field of Search ..................... 29/574, 580, 590; 317/235 H, 235 AD, 235 AJ

[56] References Cited

UNITED STATES PATENTS

| | | | |
|---|---|---|---|
| 3,519,899 | 7/1970 | Yamada | 317/235 |
| 3,435,379 | 3/1969 | Mette | 332/52 |
| 3,163,568 | 12/1964 | LeMieux | 156/17 |
| 3,250,693 | 5/1966 | Amaya | 156/17 |
| 3,290,192 | 12/1966 | Kelley | 156/17 |
| 3,440,502 | 4/1969 | Line et al. | 317/235 |
| 3,576,392 | 4/1971 | Hofstein | 317/234 UA |
| 3,584,377 | 6/1971 | Yamada | 317/235 H |

*Primary Examiner*—John W. Huckert
*Assistant Examiner*—William D. Larkins
*Attorney*—Hill, Sherman, Meroni, Gross & Simpson

[57] ABSTRACT

A magnetoresistance element comprising a semiconductor wafer having a high resistivity and having a pair of junctions formed on one surface of the wafer which are capable of injecting carriers, a portion of reduced thickness formed on the other side of the wafer and a recombining area having a high rate of recombination formed in said reduced cross-sectional portion such that the element when subjected to a magnetic field exhibits a non-linear response. The method of making the element on the semiconductor wafer is also included.

5 Claims, 18 Drawing Figures

INVENTOR.
MICHIO ARAI

BY Hill, Sherman, Meroni, Gross & Simpson ATTORNEYS

INVENTOR.
Michio Arai

BY Hill, Sherman, Meroni, Gross & Simpson ATTORNEYS

INVENTOR.
MICHIO ARAI

BY Hill, Sherman, Meroni, Gross & Simpson ATTORNEYS

INVENTOR
MICHIO ARAI

BY Hill, Sherman, Meroni, Gross & Simpson ATTORNEYS

MAGNETORESISTANCE ELEMENT AND METHOD OF MAKING THE SAME

CROSS REFERENCES TO RELATED APPLICATIONS

This invention is related to application Ser. No. 673,658 entitled MAGNETORESISTANCE ELEMENTS filed Oct. 9, 1967 by Toshiyuki Yamada, now U.S. Pat. No. 3,519,899. This invention is also related to co-pending application entitled MAGNETORESISTANCE CIRCUITS AND ELEMENTS by Toshiyuki Yamada which is referred to by Case No. 70,406 and was mailed to the U. S. Patent Office on June 5, 1970.

BACKGROUND OF THE INVENTION

1. Field of the Invention

This invention relates in general to magnetoresistance elements which are magnetosenstive semiconductor devices and in particular to a magnetoresistance element formed of silicon and to the method of making the same.

2. Description of the Prior Art

It has long been desirable to provide means for detecting weak magnetic field and to provide apparatus for inter-relating current flow with magnetic devices so that detection of magnetic fields, intermodulation between magnetic fields and electric currents and other effects may be obtained and observed.

SUMMARY OF THE INVENTION

The present invention comprises a magnetoresistance element and method of forming it in which a semiconductor device is formed by using a semiconductor wafer upon which a pair of junctions of different conductivity types are formed so as to inject carriers. The junctions are formed on one surface of the wafer and the opposite surface is formed with a portion of reduced thickness in which a recombining area is formed to as to cause a high rate of recombination of carriers. The element when placed in a magnetic field has a nonlinear response to magnetic fields of different directions and is very sensitive. A channel stopper is provided in the wafer so as to prevent a low impedance path between the pair of junctions. A method of mounting the magnetoresistance element on a header with magnetic yoke means is disclosed as well as a method of testing and producing elements which have similar characteristics. The response of the element is observed as the thickness of the wafer is decreased to form a recombining region and response of the element is observed as the thickness changes to obtain a desired response.

Other objects features and advantages of the invention will be readily apparent from the following description of preferred embodiments thereof taken in conjunction with the accompanying drawings, although variations and modifications may be effected without departing from the spirit and scope of the novel concepts of the disclosure, and in which:

BRIEF DESCRIPTIONS OF THE DRAWINGS

DESCRIPTION OF THE PREFERRED EMBODIMENTS

Figure 1:
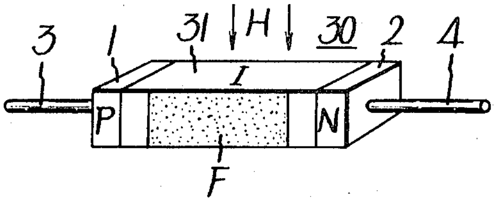
FIG. 1 is a perspective view illustrating the principle of a magnetoresistance element according to this invention.

FIG. 1 illustrates a magnetoresistance element designated generally as 30 which is formed with a main body portion 31 of semiconductor material having less carrier concentration than a p-region 1 attached to one end thereof and an n-type region 2 attached to the other end thereof. Ohmic contacts connect electrical leads 3 and 4 to the p- and n-type regions 1 and 2, respectively. A re-combining region F is asymmetrically formed on the portion 31 between the p- and n-type regions 1 and 2 so as to provide a symmetrical response of the magnetoresistance element in the presence of a magnetic field.

Figure 2A:
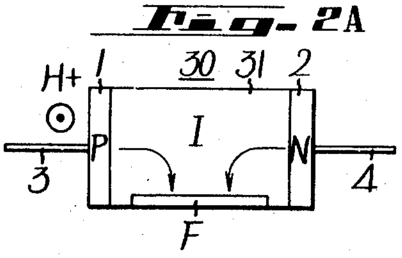
FIG. 2A illustrates a magnetoresistance element with a magnetic field having a direction out of the paper relative to the figure.
Figure 2B:
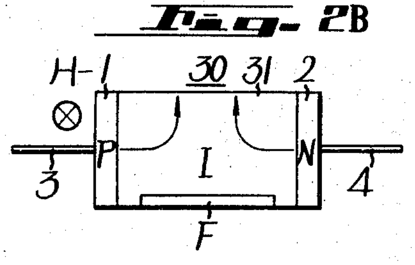
FIG. 2B illustrates the effect of a magnetic field into the paper relative to the figure and a magnetoresistance element.

FIGS. 2A and 2B illustrate the magnetoresistance element 30 from the top view. FIG. 2A, for example, illustrates the effect of a magnetic field on the magnetoresistance device 30 which has a direction which comes out of the plane of the paper relative to FIG. 2A and indicated as H+. It is to be noted that carriers are deflected toward the recombination region F which may be produced by sanding the surface of the body 31 so as to disturb the arrangement of the crystal structures and provode an increased re-combination rate. The carriers which are deflected toward the area F of increased re-combination will recombine and the effective resistance between the leads 3 and 4 will be increased by the plus magnetic field.

FIG. 2B illustrates a magnetoresistance element 30 in the presence of a magnetic field H— in which the magnetic field enters the paper opposite the field in FIG. 2A so as to cause the current carriers to be deflected away from the area F of increased re-combination. Such an orientation of the field relative to the magnetoresistance element causes a decrease in resistance since fewer of the current carriers will recombine in the area of increased re-combination F.

Figure 3:
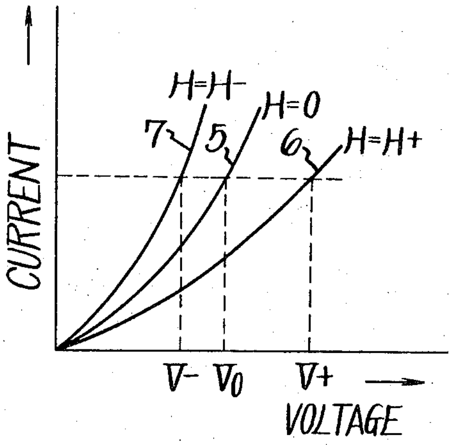
FIG. 3 is a plot of the voltage versus current as a function of a magnetic field.

The graph of FIG. 3 illustrates a curve 5 illustrating the current versus voltage relationship with no applied magnetic field having a component parallel to the recombination region F. A curve 6 illustrates the current versus voltage relationship in the presence of a magnetic field as illustrated in FIG. 2A and a curve 7 illustrates the current versus voltage relationship in the presence of a magnetic field of the orientation illustrated in FIG. 2B.

Figure 4:
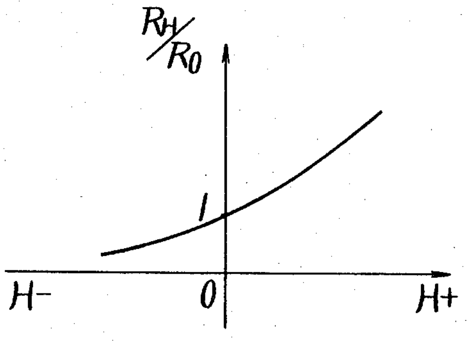
FIG. 4 is a graph showing the ratio of resistance with a magnetic field versus resistance without a magnetic field in the presence of magnetic fields of different directions.

FIG. 4 is a plot of the ratio of the resistance in the presence of a magnetic field relative to the resistance in the absence of a magnetic field as a function of magnetic field. Thus, it is to be noted that the magnetoresistance element, illustrated in FIGS. 1, 2A and 2B have a non-linear characteristic in that the resistance in substantially less in the presence of a negative magnetic field designated by H– as compared to a plus magnetic field. Thus, a magnetoresistance element according to this invention can detect the orientation as well as the magnitude of a magnetic field.

Although the magnetoresistance elements illustrated in FIGS. 1, 2A and 2B generally illustrate p- and n-type regions which might be alloyed to the material of less carrier concentration in the region 31, it is to be realized that p- and n-type regions may be formed by diffusion techniques and such a method of production is very desirable for mass production resulting in devices of uniform characteristics and of small sizes.

Generally in alloy-type junctions, wire bonding is required which is expensive and may not make a good connection. On the other hand, electrodes formed with the diffusion methods as, for example, by evaporation provide very strong and stable connection points and provide reliable leads.

Diffusion techniques work very well with silicon material which has a very desirable temperature characteristic and it is also very easy to provide an oxide layer on a silicon substrate.

Thus, the present invention provides a magnetoresistance device which is very sensitive, has very stable temperature characteristics and may be produced in large quantities with small variations.

Figure 5A:
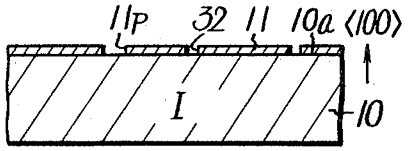
FIGS. 5A–5G are a process chart for manufacturing the magnetoresistance element according to this invention.

FIGS. 5A through 5G comprise a process chart for the manufacturing of a magnetoresistance element according to the present invention. A semiconductor substrate 10 as, for example, of silicon has a resistivity of about 10 ohms - centimeter or more. At least one surface 10*a* of the substrate 10 is etched and finished with a mirror-like surface. The etching removes a residual strain in the semiconductor material. The thickness of the substrate 10 is about 150 microns. An insulating layer 11 as, for example, of silicon dioxide is formed on the substrate 10 as illustrated in FIG. 5A. This film may be formed by the well known technique as, for example, oxidizing, a thermal decomposition method by evaporation or any other well known method. In a preferred method, the substrate 10 is heated at 1,100° C in a quartz tube containing dry oxygen of 1.5 liters per minute for a period of 3 minutes. Then the substrate is subject to oxygen bubbled through water at 80° C for 60 minutes and a silicon dioxide layer 11 of aproximately 5,000 Angstroms will be obtained. In such a process, it is generally desirable to gradually cool the substrate to avoid internal strains of the silicon substrate 10. A substrate formed with gradual cooling as, for example, 3 to 5 minutes from 1,000° C to room temperature as compared with rapid cooling from 1,000° C to room temperature in 30 seconds has been observed. The gradual cooling produces a device which is more sensitive by a factor of 20 percent to 40 percent.

A window 11*p* is formed in the silicon dioxide layer 11 by the well known photo-etching technique and the p-type region of the invention will be formed through this window. An annular channel stopper window 32 may also be formed in the layer 11 which surrounds the window 11*n* for forming a channel stopper about the n-region.

Figure 5B:
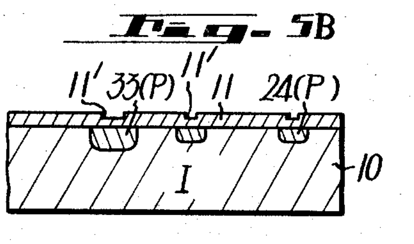
Figure 5C:
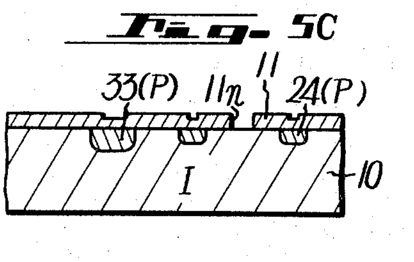
Figure 5D:
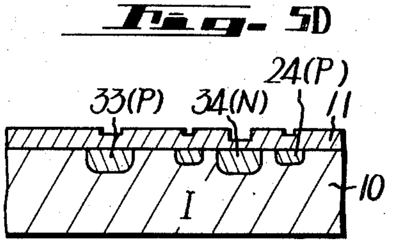

A p-region may be formed through the window 11*p* and through the annular window 32 by diffusing p-type impurity material as illustrated in FIG. 5B. After diffusion of the p-type material, an insulating layer 11′ will be formed over the windows 11*p* and 32. Then a window 11*n* as illustrated in FIG. 5C is formed through the layer 11 through which an n-type region will be formed. The n-type material is diffused as illustrated in FIG. 5D to form an n-type region 34 in the substantially intrinsic substrate 10.

Figure 5E:
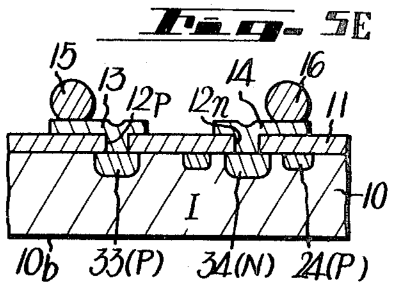

The distance between the p-type region 33 and the n-type region 34 may be about 100 microns, which is so chosen that it is several times larger than the ambipolar diffusion length in this structure. This is a necessary condition for obtaining the field-driven double injection current as shown by Lampert and Rose (Phys. Rev. 121,26 (1961) ). As illustrated in FIG. 5E, the windows 12*p* and 12*n* are opened and electrodes of, for example, aluminum indicated by numerals 13 and 14 are formed so as to make electrical contact with the p- and n-regions 33 and 34, respectively. Balls of solder (referred to as bumps) are attached to the electrodes 13 and 14 at locations so that they are not between the p- and n-regions.

Figure 5F:
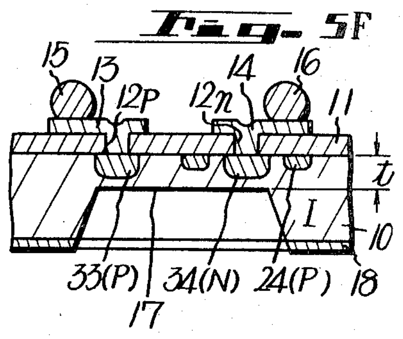
Figure 5G:
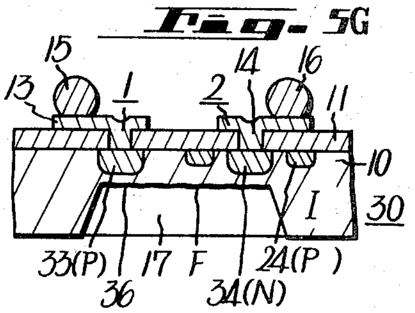

An insulating layer 18 is selectively formed on the substrate 10 on the opposite side from the insulating layer 11 and an opening is left in the layer 18 to allow the portion of the substrate 10 on the side opposite to the layer 11 to be removed adjacent the p- and n-regions. The material of the substrate 10 is etched through the opening left in the layer 18, for example, with an etchant such as alkaline aqueous KOH, NaOH, or APW solution (amine-pyrocatechol-water) to form a depression 17 which has the same width as the distance between the p- and n-regions or more and etching is continued until the thickness remaining of the substrate 10 between the bottom of the depression 17 and the layer 11 is about 30 microns as illustrated in FIG. 5F. Generally, this can be decided with the relationship of the distance between the p- and n-regions. It will be noted that the mask 18 may be formed at the same time that the layer 11 is formed or alternatively it may be formed after the structure of FIG. 5E has been produced.

If the depression 17 is formed after the electrodes 13 and 14 and bumps 15 and 16 have been attached to the surface layer they are covered with an etchant resistant material as, for example, wax or the like to protect them from the etchant as the depression 17 is formed.

It is important that etchants be used which have different characteristics with respect to every crystallographic axis of the substrate and in the present invention etching may be accomplished in the direction of the surfaces of substrate adjacent to layer 11 very rapidly so that the top portion of the depression 17 will be flat so that the thickness $t$ is uniform across the portion of the depression 17 between the p- and n-regions.

It is undesirable to have the bottom of the depression curved.

After the depression 17 is formed, its inner surface adjacent the p- and n-regions is roughened to form a re-combination region. Roughening may be accomplished, for example, by sandblasting or etching with an ultrasonic to form a re-combination region 36.

Figure 6:
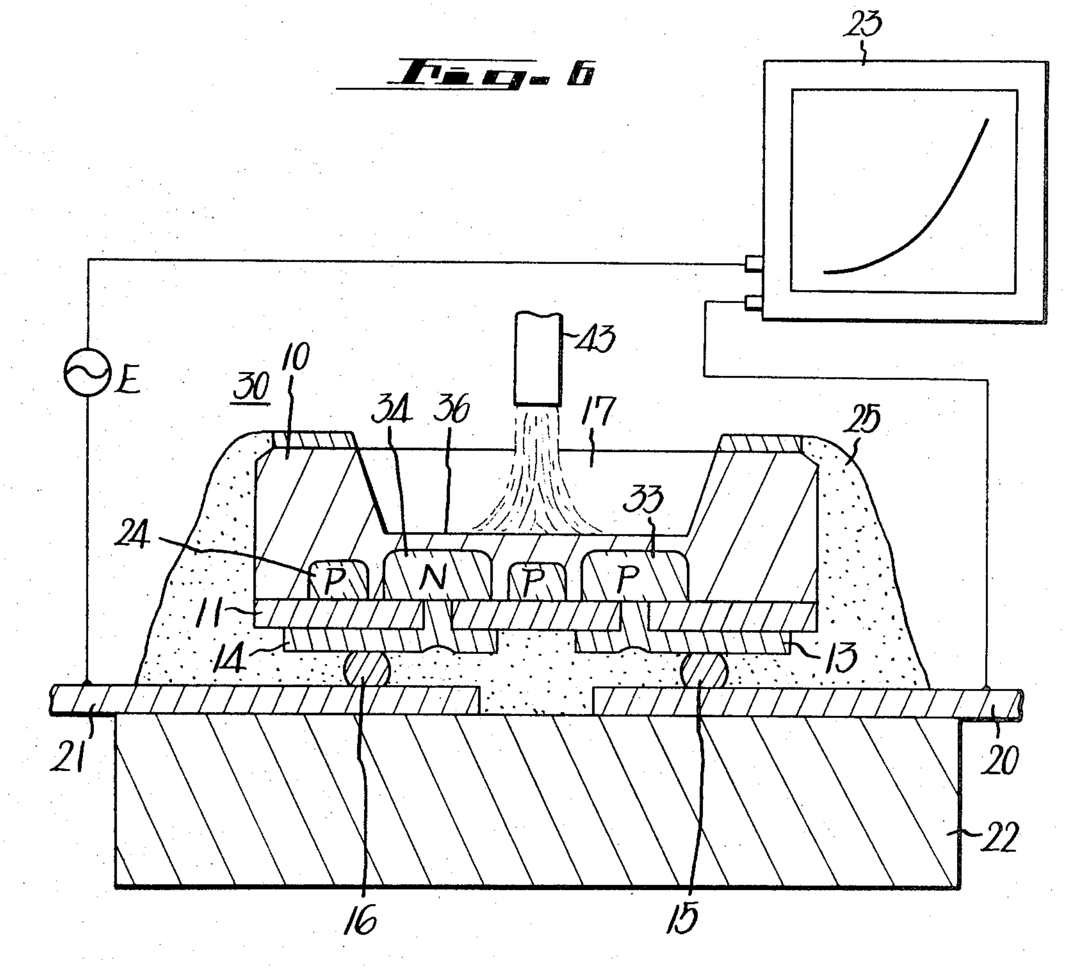
FIG. 6 illustrates a method of manufacturing the recombining area in the present invention and illustrates the method of measuring the device's characteristics.

The manner of forming the re-combination region 36 is illustrated in FIG. 6.

Figure 9:
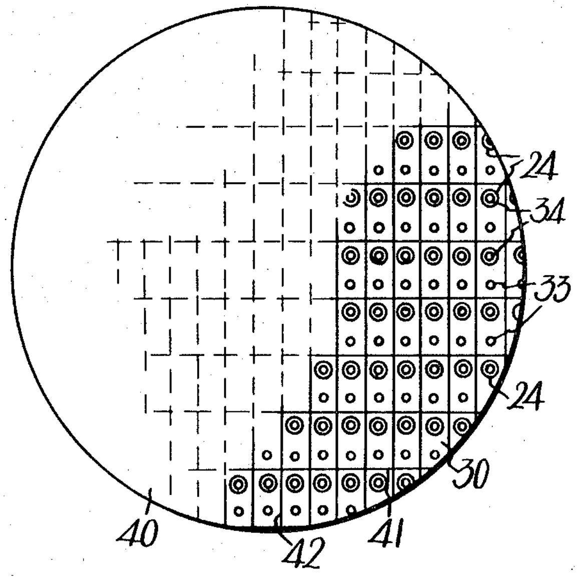
FIG. 9 is a plane view illustrating a plurality of magnetoresistance elements according to this invention.

Although the process for producing magnetoresistance elements according to this invention has been described with respect to a single unit with regard to FIGS. 5A through 5G, it is to be realized that many magnetoresistance elements may be made at one time. FIG. 9 illustrates a silicon slice designated generally as 40 upon which many magnetoresistance elements 30 are simultaneously formed. The elements will be separated on division lines 41 and 42 and may be individually mounted on a supporting header. The channel stoppers 24 surround the n-type regions 34 as shown.

As shown in FIG. 6, each of the elements 30 after being cut to size is mounted on an insulating header 22 which has printed or plated leads 20 and 21 that are attached to the balls 15 and 16 which respectively connect to the p- and n-regions of the device. An epoxy resin 25 is applied to mold the insulator 20 to the leads 20 and 21 and the magnetoresistance element 30 to form a unitary unit. It is to be noted that the depression 17 is left free.

The voltage source E is connected to the leads 20 and 21 and to a cathode ray oscilloscope 23 and a sandblasting nozzle 43 applies sand to the depression 17 so as to reduce the thickness and tune the device. Observing the cathode ray oscilloscope 23 the current versus voltage characteristic of the device may be observed and the pressure of the sandblast from the nozzle 43 may be decreased when the thickness $t$ decreases so as to obtain the desired characteristic. Thus, devices according to the invention which have the same characteristic may be produced uniformly.

Although the device has been shown as being mounted to a header 22 prior to sandblasting, it is also possible to form the roughened area prior to attaching the device to the header.

Generally an n-channel will be formed under the insulating layer 11 which is undesirable and in the present invention the channel stopper 24 which may be a p-type diffused ring around the n- or p-region will cut the current passing between the p- and n-regions.

Figures 7A, 7B, 8A, 8B:
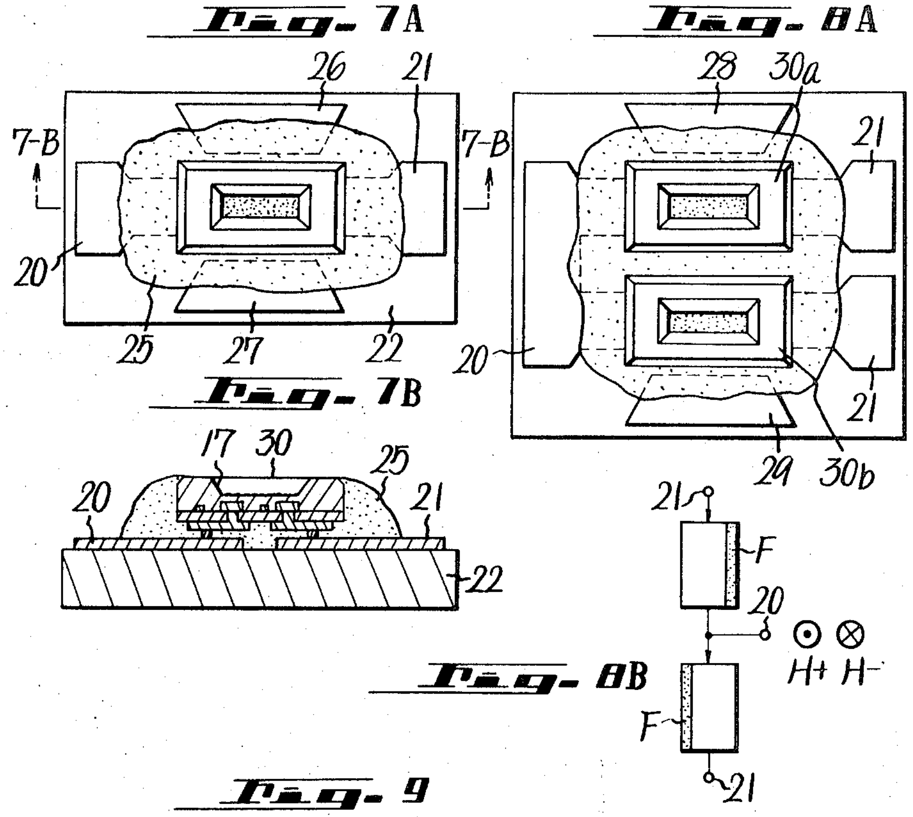
FIG. 7A illustrates a magnetoresistance element according to the invention mounted on a header.
FIG. 7B is a cross-sectional view taken from FIG. 7A on line 7B—7B.
FIG. 8A illustrates a pair of magnetoresistance elements mounted on a header.
FIG. 8B is a schematic view illustrating the magnetoresistance elements of FIG. 8A.

As illustrated in FIGS. 7A, 7B, 8A and 8B, a magnetic field may be applied to control the current and the resistivity of the device. In FIG. 7A, for example, magnetic yokes which might be of ferrite material 26 and 27 are mounted on opposite sides of the unit 30 so as to pass a magnetic field through the device. FIG. 8A illustrates a pair of magnetic yokes 28 and 29 which pass a magnetic field by a pair of magnetoresistance elements **30*a* and 30*b* which are connected by leads 20 and 21. FIG. 8B is a schematic view of the device of FIG. 8**A and it is to be noted that the re-combination regions F are on opposite sides relative to the direction of the magnetic field H. Thus a very sensitive device for detecting magnetic fields is provided.

After the magnetic yokes and the re-combination regions have been properly formed, the device may be encapsulated by applying an epoxy resin to protect the device. The leads 20 and 21 are of course allowed to extend from the device so that they are availble for electrical connections.

It is to be noted that during all of the processes, the smooth surface on the side opposite the re-combination region F has been covered with the oxide layer 11 and it will not be contaminated. Also the smooth surface does not directly contact the plastic mold and the re-combination rate will not be reduced because of contact with the mold. It is very desirable to keep the re-combination rate low on the smooth side relative to the roughened area F.

It is seen that this invention provides a new and novel magnetoresistance element and method of making the same and although it has been described with respect to preferred embodiments it is not to be so limited as changes and modifications may be made therein which are within the full intended scope as defined by the appended claims.

I claim as my invention:

1. The method of forming a magnetoresistance element comprising:

a. etching one surface of a semiconductor wafer of silicon to form a region having a low recombination rate;

b. forming an insulating layer of silicon dioxide over said one surface of said silicon dioxide layer having a pair of windows separated by about 100 microns;

c. forming a pair of junctions of opposite conductivity types in said wafer through said pair of windows;

d. forming a pair of electrodes on said insulating layer which are electrically connected to said pair of junctions;

e. forming a pair of bumps of electrical conducting material on said pair of electrodes and separated from each other more than 100 microns;

f. forming a pair of electrical leads on a header of electrical insulating material;

g. attaching said header to said semiconductor wafer by electrically insulating bonding material such that said electrical leads are respectively connected to said pair of pumps;

h. forming a depression with a planar bottom in said semiconductor wafer on said second surface having a width of about 100 microns and such that said wafer in said depression has a thickness of 15 to 50 microns; and i. roughening the surface of said wafer in said depression to form a recombination region of high recombination rate and wherein steps (a), (b), (c), (d), (e), (g), (h) and (i) are performed in the order listed.

2. The method of claim 1 comprising the steps of forming an additional window in said insulating layer between said pair of junctions and forming a channel stopper in said wafer between said pair of junctions.

3. In the method of claim 2 wherein said surface in the depression is roughened by sand blasting.

4. In the method of claim 2 wherein said surface in the depression is roughened by etching with ultrasonics.

5. In the method of claim 2 comprising supplying a voltage across said electrodes, and monitoring the voltage versus current characteristic of the magnetoresistance element as roughening occurs to obtain the desired characteristic.

* * * * *

UNITED STATES PATENT OFFICE
CERTIFICATE OF CORRECTION

Patent No. 3,747,201 Dated July 24, 1973

Inventor(s) Michio Arai

It is certified that error appears in the above-identified patent and that said Letters Patent are hereby corrected as shown below:

Column 2, line 54, change "provode" to --provide--.

Column 6, line 43, change "pumps" to --bumps--.

Signed and sealed this 16th day of July 1974.

(SEAL)
Attest:

McCOY M. GIBSON, JR.
Attesting Officer

C. MARSHALL DANN
Commissioner of Patents